(12) United States Patent
Pu et al.

(10) Patent No.: US 7,208,825 B2
(45) Date of Patent: Apr. 24, 2007

(54) STACKED SEMICONDUCTOR PACKAGES

(75) Inventors: Han-Ping Pu, Taichung (TW); Chien Ping Huang, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 11/125,886

(22) Filed: May 9, 2005

(65) Prior Publication Data

US 2005/0205978 A1   Sep. 22, 2005

Related U.S. Application Data

(63) Continuation-in-part of application No. 10/404,173, filed on Apr. 1, 2003, now Pat. No. 6,891,273.

(30) Foreign Application Priority Data

Jan. 22, 2003   (TW) .............................. 92101310 A

(51) Int. Cl.
H01L 23/48   (2006.01)
H01L 23/02   (2006.01)
H01L 23/52   (2006.01)
H01L 23/28   (2006.01)
H01L 23/31   (2006.01)

(52) U.S. Cl. .............................. 257/686; 257/E23.178; 257/E25.013; 257/685; 257/777; 257/723; 257/778; 257/673; 257/780; 257/738; 257/737

(58) Field of Classification Search ........ 257/E23.178, 257/E23.021, E21.512, E25.013, 686, 685, 257/777, 723, 780, 666, 690–693, 698, 701, 257/737, 738, 778
See application file for complete search history.

(56) References Cited

U.S. PATENT DOCUMENTS

| | | | |
|---|---|---|---|
| 5,581,122 A | 12/1996 | Chao et al. | |
| 6,020,629 A * | 2/2000 | Farnworth et al. | 257/686 |
| 6,291,259 B1 * | 9/2001 | Chun | 438/106 |
| 6,313,528 B1 * | 11/2001 | Solberg | 257/723 |
| 6,396,136 B2 * | 5/2002 | Kalidas et al. | 257/691 |
| 6,501,165 B1 * | 12/2002 | Farnworth et al. | 257/686 |
| 6,506,632 B1 | 1/2003 | Cheng et al. | |
| 6,646,334 B2 * | 11/2003 | Hur | 257/686 |
| 6,680,529 B2 * | 1/2004 | Chen et al. | 257/700 |
| 6,750,397 B2 * | 6/2004 | Ou et al. | 174/52.4 |
| 6,847,105 B2 * | 1/2005 | Koopmans | 257/686 |
| 6,946,325 B2 * | 9/2005 | Yean et al. | 438/112 |

(Continued)

Primary Examiner—Alexander Oscar Williams
(74) Attorney, Agent, or Firm—Peter F. Corless; Steven M. Jensen; Edwards Angell Palmer & Dodge LLP

(57) ABSTRACT

A semiconductor package and a fabrication method thereof are provided in which a chip is mounted on a substrate, and a dielectric layer is applied over the substrate and chip, with bond fingers formed on the substrate and electric contacts formed on the chip being exposed outside. A metal layer is formed over the dielectric layer and the exposed bond fingers and electric contacts, and patterned to form a plurality of conductive traces that electrically connect the electric contacts of the chip to the bond fingers of the substrate. The conductive traces replace conventional wire bonding technology and thus eliminate the occurrence of wire sweep or short circuits in fabrication processes. Therefore, a low profile chip with a reduced pitch between adjacent electric contacts can be used without being limited to feasibility of the wire bonding technology.

4 Claims, 5 Drawing Sheets

U.S. PATENT DOCUMENTS

| | | |
|---|---|---|
| 2002/0020898 A1* | 2/2002 | Vu et al. .................... 257/676 |
| 2003/0087538 A1* | 5/2003 | Ueno ......................... 439/68 |
| 2003/0133274 A1* | 7/2003 | Chen et al. ................. 361/760 |
| 2003/0134455 A1 | 7/2003 | Cheng et al. |
| 2004/0140573 A1* | 7/2004 | Pu et al. ..................... 257/782 |
| 2004/0178495 A1* | 9/2004 | Yean et al. ................. 257/723 |
| 2004/0245614 A1* | 12/2004 | Jobetto ....................... 257/678 |
| 2005/0161833 A1* | 7/2005 | Takeuchi et al. ............ 257/775 |

* cited by examiner

STACKED SEMICONDUCTOR PACKAGES

CROSS-REFERENCE TO RELATED APPLICATION

This application is a continuation-in-part of application Ser. No. 10/404,173 filed on Apr. 1, 2003 now U.S. Pat. No. 6,891,273, the disclosure of which is expressly incorporated herein by reference.

FIELD OF THE INVENTION

The present invention relates to semiconductor packages and fabrication methods thereof, and more particularly, to a semiconductor package for use with a chip having a small pitch between adjacent bond pads or electric contacts, and a method for fabricating the semiconductor package.

BACKGROUND OF THE INVENTION

A ball grid array (BGA) semiconductor package is normally incorporated with a semiconductor chip on a substrate and electrically connects the chip to the substrate via a plurality of bonding wires.

With increasing integration of a chip having higher density of bond pads, more bonding wires need to be formed accordingly and a pitch between adjacent bonding wires is reduced to accommodate more bonding wires on a limited-sized chip. However, the reduced pitch makes adjacent bonding wires more closely arranged with respect to each other; in a subsequent molding process, these closely arranged bonding wires would be easily subject to wire sweep or wire short, thereby adversely affecting quality of a fabricated semiconductor package.

In response to the above problem, U.S. Pat. No. 5,581,122 discloses a semiconductor package in which a ground ring 17 and a power ring 18 are formed on a substrate 10 between bond fingers 102 for being bonded with bonding wires 110 and an area where a chip 11 is mounted, as shown in FIG. 1. Ground wires 112 and power wires 111 are formed to electrically connect ground pads and power pads (not shown) on an active surface of the chip 11 respectively to the ground ring 17 and power ring 18 on the substrate 10, which are arranged spatially in different layers with respect to the bonding wires 110 to thereby increase a pitch between adjacent wires and prevent circuit short due to wire sweep or shift.

However, as the chip is developed with lower profile and higher density of bonding wires, a pitch between adjacent bond pads formed on an active surface of the chip is decreased from 60 µm to 40 µm and even to 30 µm to accommodate more I/O (input/output) connections thereon, in order to reduce fabrication costs and enhance chip performances. As a result, the above layered arrangement of bonding wires is not suitably applied to such a delicate chip with a fine pad pitch.

Moreover, in accordance with the reduced pad pitch of the chip, a pitch between bond fingers formed on the substrate is decreased from 150 µm to 125 µm and even to 100 µm for a new generation of substrates; such a small bond-finger pitch arrangement makes bonding wires bonded thereto easily come into contact with each other and cause circuit short, and the above package structure still fails to solve this problem.

In another aspect, if the bond-pad pitch is further reduced to 30 µm, a current wire bonder may not be feasible to perform such a delicate wire bonding process, and also a conventional etching technique may hardly achieve a pitch below 100 µm between adjacent bond fingers on the substrate.

The above wire-bonding problem may be solved through the use of flip-chip technology. However, the flip-chip technology requires a complex solder bumping process used for electrically connecting the chip to the substrate, and the substrate serving as a chip carrier needs to be manufactured by build-up technology instead of conventional fabrication processes, which would increase production costs of the substrate up to around five times more than that of a conventional substrate; such an expensive substrate is hardly acceptable in the market.

SUMMARY OF THE INVENTION

An objective of the present invention is to provide a semiconductor package and a fabrication method thereof without having to use bonding wires for electrically connecting a chip to a substrate, so as to eliminate circuit short of the bonding wires in a molding process.

Another objective of the invention is to provide a semiconductor package and a fabrication method thereof, which can be applied to a chip with a reduced pitch between adjacent electric contacts without having to use a complex solder bumping process or an expensive substrate made by build-up technology.

In accordance with the foregoing and other objectives, the present invention proposes a semiconductor package, including: a substrate having a front surface and a back surface, the front surface being formed with a chip attach area and a plurality of bond fingers around the chip attach area; at least one chip mounted on the chip attach area, the chip having an active surface and a non-active surface, wherein the active surface of the chip is formed with a plurality of electric contacts each of which corresponds to one of the bond fingers; a dielectric layer applied over the substrate for covering the active surface of the chip and the front surface of the substrate, with the electric contacts and bond fingers being exposed to outside of the dielectric layer; a plurality of conductive traces formed on the dielectric layer for electrically connecting the electric contacts to the bond fingers; an insulating layer for covering the electric contacts, conductive traces, and bond fingers; and a plurality of solder balls implanted on the back surface of the substrate for electrically connecting the chip to an external device.

A method for fabricating the above semiconductor package includes the steps of: preparing a substrate having a front surface and a back surface, the front surface being formed with a chip attach area and a plurality of bond fingers around the chip attach area; mounting at least one chip on the chip attach area, the chip having an active surface and a non-active surface, wherein the active surface of the chip is formed with a plurality of electric contacts each of which corresponds to one of the bond fingers; applying a dielectric layer over the substrate to cover the active surface of the chip and the front surface of the substrate, with the electric contacts and bond fingers being exposed to outside of the dielectric layer; forming a metal layer over the dielectric layer to cover and interconnect the electric contacts and bond fingers; patterning the metal layer to form a plurality of conductive traces, the conductive traces having one end thereof connected to the electric contacts and the other end connected to the corresponding bond fingers; forming an insulating layer over the electric contacts, conductive traces, and bond fingers; and implanting a plurality of solder balls on the back surface of the substrate for electrically connecting the chip to an external device.

By the provision of conductive traces for electrically connecting electric contacts of the chip to bond fingers of the substrate, conventional bonding wires are not required for the electrical connection purpose, which can thereby solve the problem of wire-bonding difficulty for a low profile chip with a reduced pitch between adjacent electric contacts and also can eliminate the occurrence of wire sweep or wire short in a molding process. Moreover, it is not necessary to use a complex solder bumping process for electrical connection between the chip and the substrate or employ an expensive build-up technique to fabricate the substrate, thereby reducing fabrication costs of the semiconductor package.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments of a semiconductor package and a fabrication method thereof proposed by the present invention are described in detail as follows with reference to FIGS. 2 to 6.

First Preferred Embodiment

Figure 1:
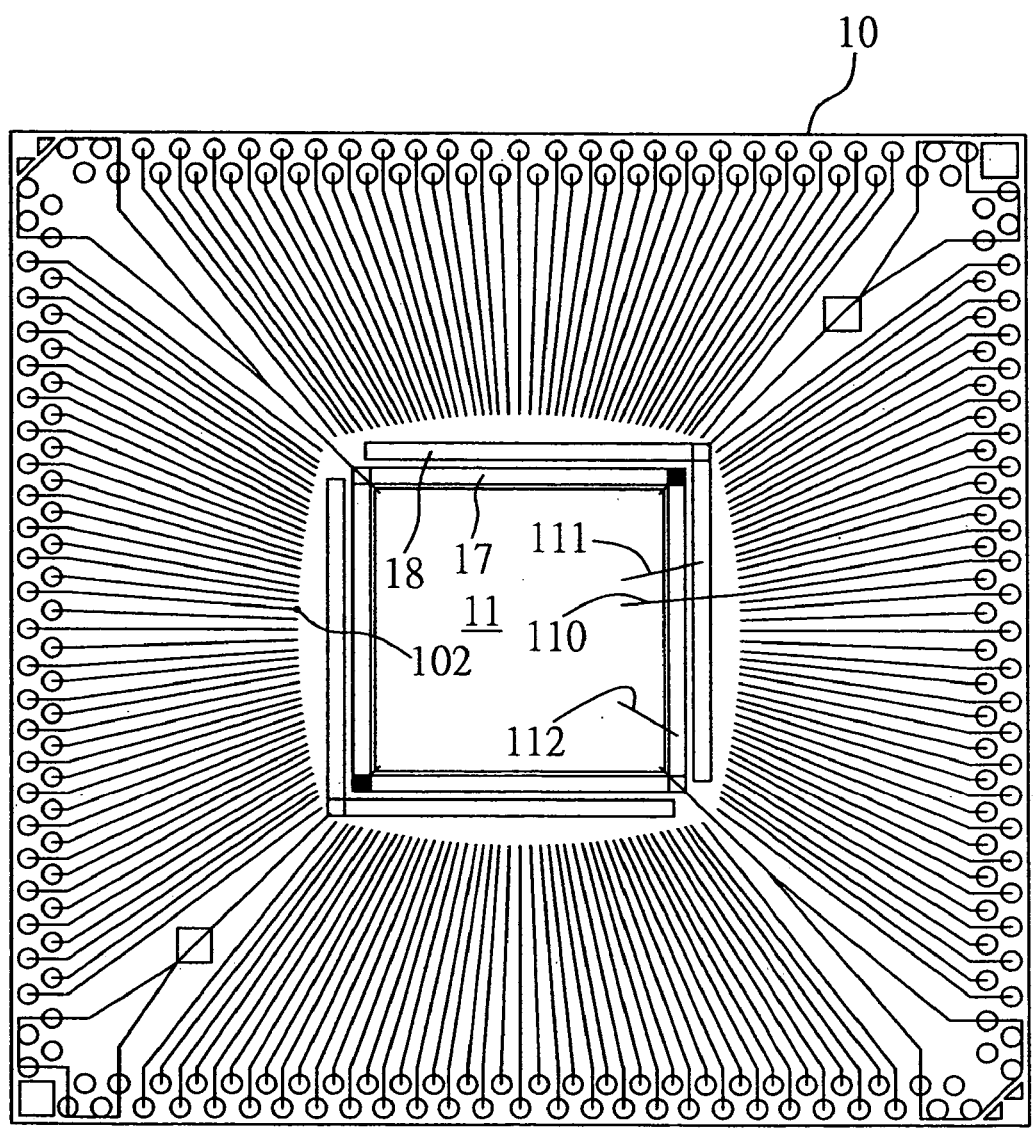
FIG. 1 (PRIOR ART) is a top view of a conventional semiconductor package disclosed by U.S. Pat. No. 5,581,122.
Figure 2:
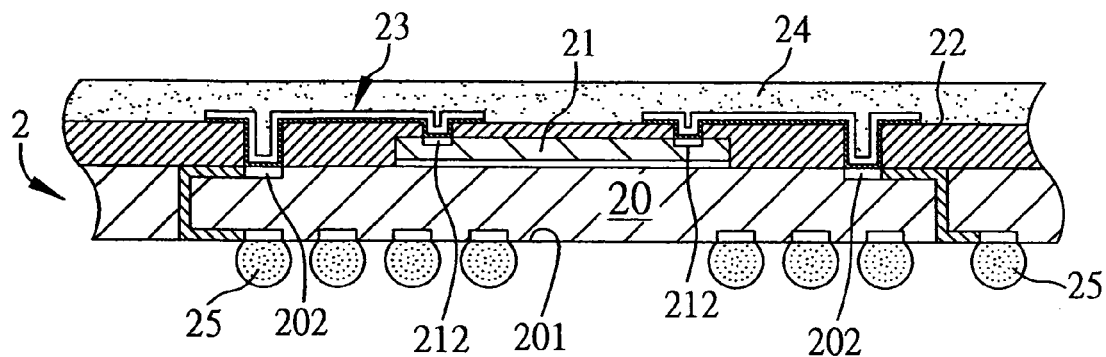
FIG. 2 is a cross-sectional view of a semiconductor package according to a first preferred embodiment of the invention.

As shown in FIG. 2, the semiconductor package 2 according to the invention includes a substrate 20; a semiconductor chip 21 mounted on the substrate 20, the chip 21 being formed with a plurality of electric contacts 212 each of which corresponds to one of bond fingers 202 formed on the substrate 20; an insulating dielectric layer 22 applied over the substrate 20, with the electric contacts 212 and bond fingers 202 being exposed to outside of the dielectric layer 22; a plurality of conductive traces 23 formed on the dielectric layer 22 for electrically connecting the electric contacts 212 to the bond fingers 202; an insulating layer 24 for covering the electric contacts 212, conductive traces 23, and bond fingers 202; and a plurality of solder balls 25 implanted on the bottom of the substrate 20.

The above semiconductor package 2 can be fabricated by procedural steps illustrated in FIGS. 3A to 3E.

Figure 3A:
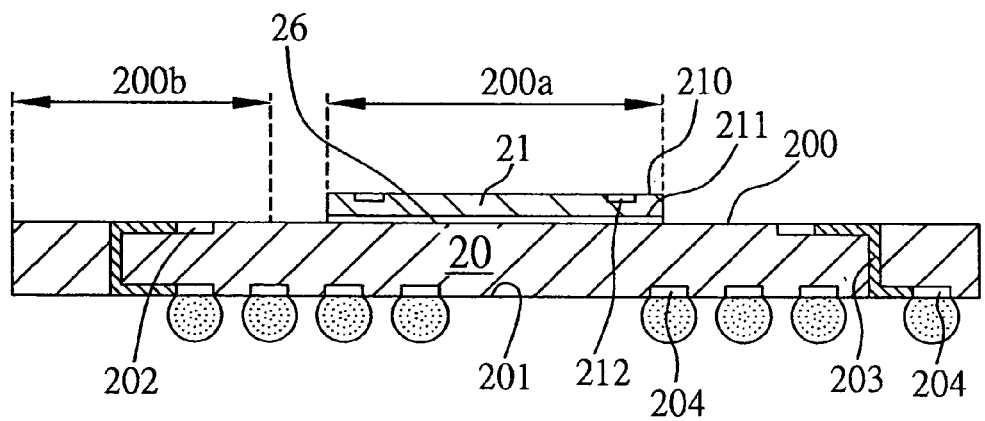
FIGS. 3A–3E are schematic diagrams showing procedural steps for fabricating the semiconductor package shown in FIG. 2.

Referring to FIG. 3A, the first step is to prepare a substrate 20 and at least one semiconductor chip 21. The substrate 20 is made of a conventional material such as BT (bismaleimide triazine) resin, FR-4 resin, ceramic, etc. The substrate 20 has a front surface 200 and a back surface 201 opposed to the front surface 200, wherein the front surface 200 is defined with a chip attach area 200a and a finger forming area 200b around the chip attach area 200a, and the finger forming area 200b is formed with a plurality of bond fingers 202. Each of the bond fingers 202 is electrically coupled through a conductive via 203 to a corresponding ball pad 204 formed on the back surface 201 of the substrate 20 so as to allow signals from the chip 21 mounted on the substrate 20 to be transmitted via the bond fingers 202, substrate 20, and solder balls (not shown) to the outside.

Further as shown in the drawing, a wafer is ground to be 3 mils thick and cut into a plurality of individual semiconductor chips 21, allowing the chip 21 to be attached via an adhesive 26 (such as silver paste) to the chip attach area 200a. The chip 21 has an active surface 210 and a non-active surface 211, wherein the active surface 210 is formed with a plurality of electric contacts 212 each of which corresponds to one of the bond fingers 202 formed on the substrate 20.

Figure 3B:
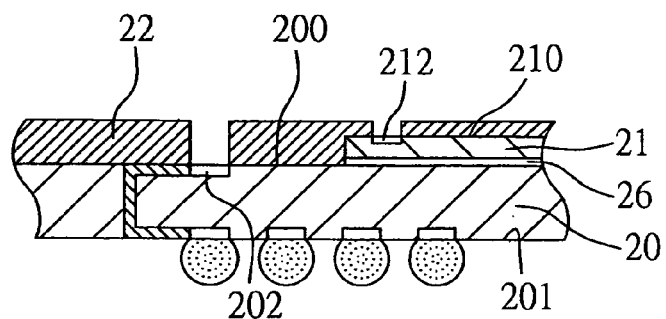

Referring to FIG. 3B, the next step is to apply a dielectric layer 22 over the substrate 20 and the chip 21. The dielectric layer 22 is made of an electrically insulating material such as polyimide or epoxy resin, and is formed by a screen printing or spin coating technique over the front surface 200 of the substrate 20 and the active surface 210 of the chip 21, with the electric contacts 212 and bond fingers 202 being exposed to outside of the dielectric layer 22.

Figure 3C:
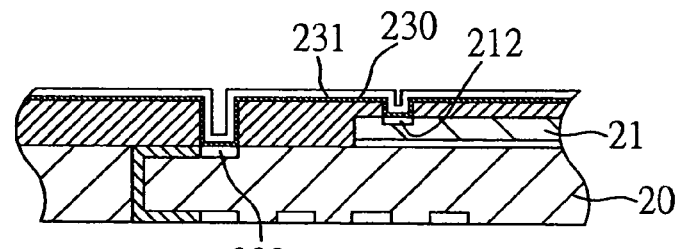

Referring to FIG. 3C, a sputtering or electroless plating technique is employed to apply a thin metal layer 230 over the dielectric layer 22 and the exposed electric contacts 212 and bond fingers 202. The thin metal layer 230 can be made of titanium (Ti), nickel/vanadium (Ni/V) alloy, titanium/tungsten (Ti/W) alloy, chromium (Cr), nickel (Ni), or copper (Cu). Then, a trace forming layer 231 made of nickel (Ni), copper (Cu), nickel alloy, or copper alloy, is formed by electroplating over the thin metal layer 230 so as to allow the electric contacts 212 of the chip 21 to be electrically connected to the bond fingers 202 on the substrate 20.

Figure 3D:
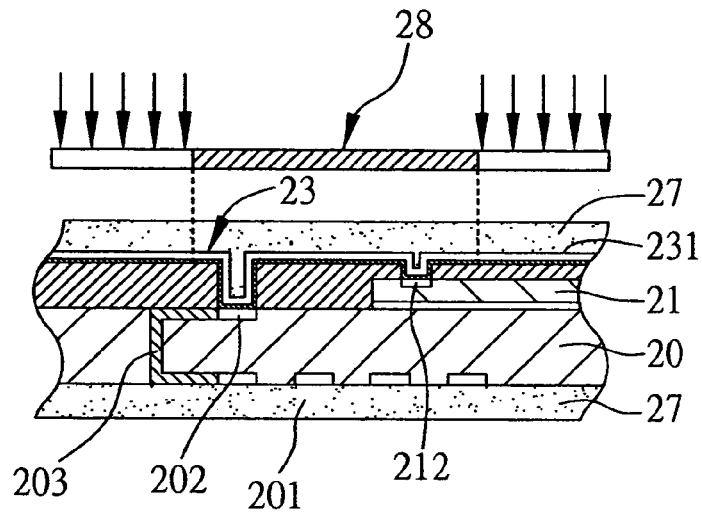

Then, referring to FIG. 3D, a photoresist layer 27 is formed over the trace forming layer 231 and the back surface 201 of the substrate 20 respectively, and a photo mask 28 is used to pattern the thin metal layer 230 and trace forming layer 231 by conventional exposing, developing, and etching processes to form a plurality of conductive traces 23 having one end thereof connected to the electric contacts 212 of the chip 21 and the other end connected to the bond fingers 202 of the substrate 20, such that the electric contacts 212 of the chip 21 can be electrically coupled to the corresponding bond fingers 202 on the substrate 20 without having to utilize conventional wire bonding technology.

Figure 3E:
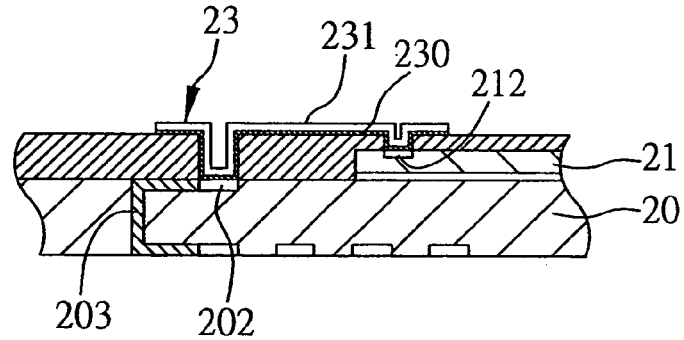

Thereafter, referring to FIG. 3E, after completing patterning of the thin metal layer 230 and trace forming layer 231, a conventional wet or dry stripping process is adopted to remove the photoresist layers (not shown) from the trace forming layer 231 and the back surface 201 of the substrate 20.

Referring back to FIG. 2, an insulating layer 24 made of epoxy resin or polyimide is applied over the front surface 200 of the substrate 20 by a molding or coating technique and covers the electric contacts 212, conductive traces 23, and bond fingers 202. And, a plurality of solder balls 25 are implanted on the back surface 201 of the substrate 20; this forms an electrical connection path including the electric contacts 212, conductive traces 23, bond fingers 202, conductive vias 203, and solder balls 25 for the semiconductor package 2.

Second Preferred Embodiment

Figure 4:
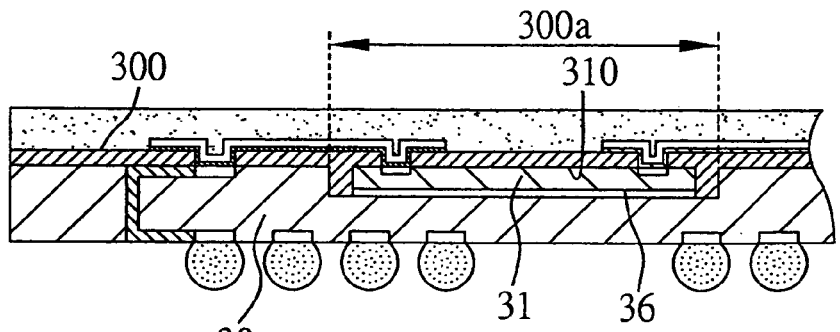
FIG. 4 is a cross-sectional view of a semiconductor package according to a second preferred embodiment of the invention.

FIG. 4 illustrates a semiconductor package according to a second preferred embodiment of the invention. This semiconductor package differs from that of the above first embodiment in that the substrate 30 is formed with an opening 300a larger in surface area than the chip 31, allowing the chip 31 to be received within the opening 300a and adhered to the substrate 30 via an adhesive 36. This structure reduces height difference between an active surface 310 of the chip 31 and a front surface 300 of the substrate 30, thereby diminishing the overall height of the semiconductor package and making a dielectric layer (not designated with a reference numeral) more convenient to be applied over the substrate 30.

Third Preferred Embodiment

Figure 5:
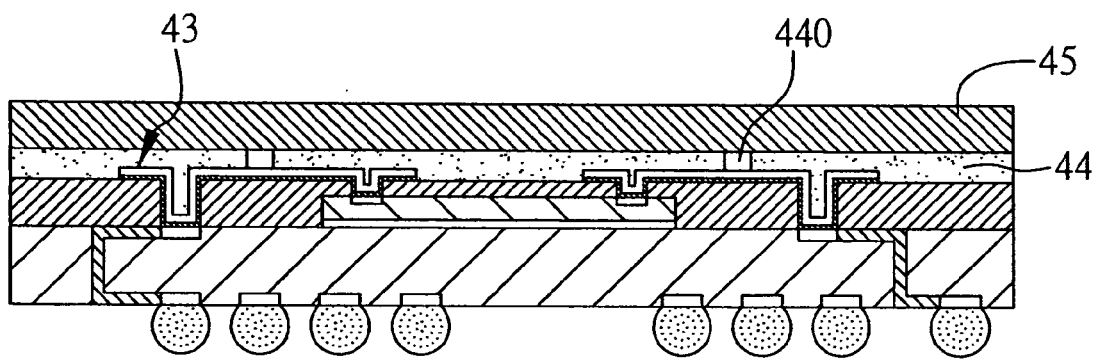
FIG. 5 is a cross-sectional view of a semiconductor package according to a third preferred embodiment of the invention.

FIG. 5 illustrates a semiconductor package according to a third preferred embodiment of the invention. This semiconductor package differs from that of the above first embodiment in that after completing formation of the insulating layer 44, a plurality of openings 440 are formed through the insulating layer 44 at positions corresponding to ground traces 43 i.e. predetermined conductive traces used for the grounding purpose. As a result, a heat sink 45 mounted on the insulating layer 44 can be adapted to be electrically connected to the ground traces 43 via the openings 440 to enhance heat dissipating performances of the semiconductor package and provide an EMI (electric and magnetic interference) shielding effect.

Fourth Preferred embodiment

Figure 6:
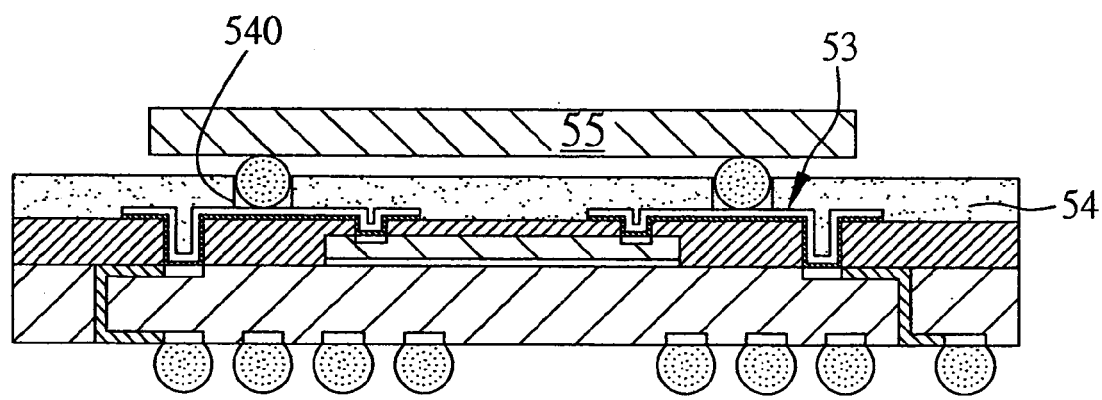
FIG. 6 is a cross-sectional view of a semiconductor package according to a fourth preferred embodiment of the invention.

FIG. 6 illustrates a semiconductor package according to a fourth preferred embodiment of the invention. This semiconductor package differs from that of the above first embodiment in that after completing formation of the insulating layer 54, a plurality of openings 540 are formed through the insulating layer 54 at positions corresponding to the conductive traces 53, so as to allow another package assembly (not shown) or chip 55 to be electrically connected to the semiconductor package via the openings 540 to thereby form a multi-chip module (MCM).

Fifth Preferred Embodiment

Figure 7:
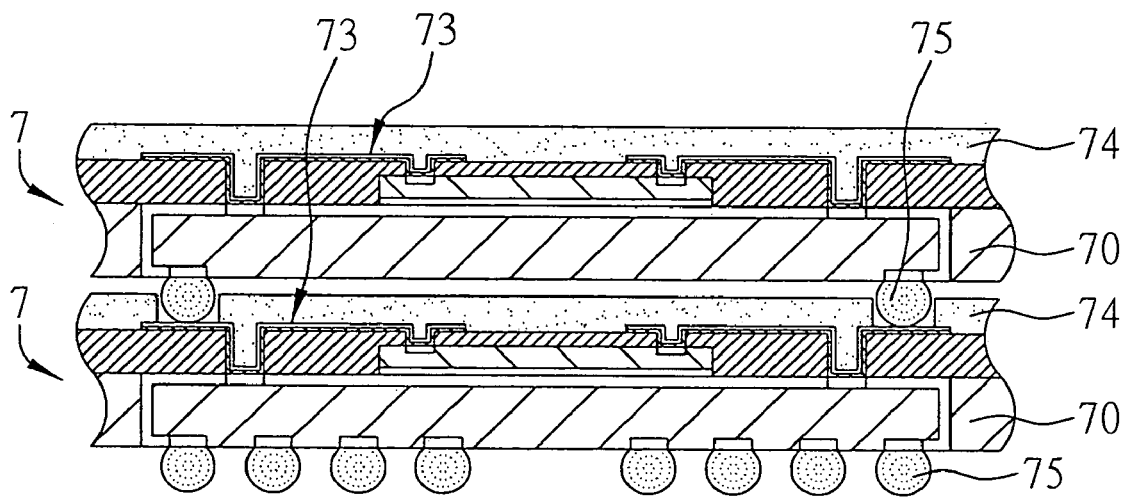
FIG. 7 is a cross-sectional view of a semiconductor package structure according to a fifth preferred embodiment of the invention.

FIG. 7 illustrates a semiconductor package structure according to a fifth preferred embodiment of the invention. The fabrication method and structure in the fifth embodiment are substantially the same as those in the foregoing embodiments, with a primary difference in that a plurality of fabricated semiconductor packages 7 complete with chip encapsulation are prepared for stacking, wherein an insulating layer 74 of an underlying semiconductor package 7 is formed with apertures for exposing a portion of a conductive trace layer 73 under the insulating layer 74, such that an overlying semiconductor package 7 can be mounted and stacked on the underlying semiconductor package 7 by electrically connecting solder balls 75 implanted on a back surface of a substrate 70 of the overlying semiconductor package 7 to the portion of the conductive trace layer 73 exposed from the insulating layer 74 of the underlying semiconductor package 7. As a result, the semiconductor packages can be rapidly stacked to form a highly integrated package structure.

It is to be noted that the stacked structure of semiconductor packages is not limited to two layers shown in FIG. 7, but can be increased to more than two layers according to practical electrical and functional requirements.

By the foregoing provision of conductive traces for electrically connecting electric contacts of the chip to bond fingers of the substrate, conventional bonding wires are not required for the electrical connection purpose, which can thereby solve the problem of wire-bonding difficulty for a low profile chip with a reduced pitch between adjacent electric contacts and also can eliminate the occurrence of wire sweep or wire short in a molding process. Moreover, it is not necessary to use a complex solder bumping process for electrical connection between the chip and the substrate or employ an expensive build-up technique to fabricate the substrate, thereby reducing fabrication costs of the semiconductor package.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package structure comprising a plurality of stacked semiconductor packages, each of the semiconductor packages comprising:

a substrate having a front surface and a back surface opposite to the front surface, the front surface being formed with a chip attach area and a plurality of bond fingers around the chip attach area;

at least one chip having an active surface and a non-active surface opposite to the active surface, wherein the chip is mounted via its non-active surface on the chip attach area, and the active surface of the chip is formed with a plurality of electric contacts;

a dielectric layer applied over the front surface of the substrate, for covering the active surface of the chip and the front surface of the substrate, with the electric contacts and the bond fingers being exposed from the dielectric layer;

a conductive trace layer formed on the dielectric layer, for electrically connecting the electric contacts to the bond fingers;

an insulating layer for covering the conductive trace layer and the dielectric layer, with a portion of the conductive trace layer being exposed from the insulating layer; and a plurality of solder balls implanted on the back surface of the substrate;

wherein the solder balls of an overlying one of the semiconductor packages are electrically connected to the portion of the conductive trace layer exposed from the insulating layer of an underlying one of the semiconductor packages so as to stack the overlying one of the semiconductor packages on the underlying one of the semiconductor packages.

2. The semiconductor package structure of claim 1, wherein the chip is ground to a thickness below 3 mils.

3. The semiconductor package structure of claim 1, wherein the dielectric layer is made of an electrically insulating material selected from the group consisting of polyimide and epoxy resin.

4. The semiconductor package structure of claim 1, wherein the insulating layer is made of epoxy resin or polyimide.

* * * * *